(12) United States Patent
Kim

(10) Patent No.: US 7,183,865 B2
(45) Date of Patent: Feb. 27, 2007

(54) OSCILLATOR CIRCUIT OPERATING WITH A VARIABLE DRIVING VOLTAGE

(75) Inventor: Kyung Whan Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/006,386

(22) Filed: Dec. 7, 2004

(65) Prior Publication Data
US 2005/0122175 A1    Jun. 9, 2005

(30) Foreign Application Priority Data
Dec. 8, 2003    (KR) ...................... 10-2003-0088634

(51) Int. Cl.
*H03B 27/00* (2006.01)
(52) U.S. Cl. ............................. 331/57; 331/74; 331/34; 331/175
(58) Field of Classification Search ................ 331/57, 331/74, 175, 34
See application file for complete search history.

(56) References Cited

U.S. PATENT DOCUMENTS 5,406,228 A    4/1995    Hoang 6,462,625 B2 *   10/2002   Kim ............................ 331/57

FOREIGN PATENT DOCUMENTS

JP    2000 188527    7/2000

\* cited by examiner

*Primary Examiner*—Arnold Kinkead
(74) *Attorney, Agent, or Firm*—Ladas & Parry LLP

(57) ABSTRACT

An oscillator operates with a variable driving voltage to produce an oscillation signal of a predetermined period in a semiconductor device. The oscillator has a plurality of logic devices connected to each other in a form of a ring. The oscillator includes a voltage generating circuit for generating first and second driving voltages which are selectively applied to the logic devices. The selective application of the first or second driving voltage to the logic devices affects the period of the oscillation signal produced. The first driving voltage is applied to the logic devices for normal operations when the oscillation signal period is tested to substantially equal the predetermined period. The second driving voltage is applied to the logic devices for normal operations when the oscillation signal period is tested to be different from the predetermined period. The second driving voltage is adjusted by changing the resistance ratio of at least two resistors in the circuit.

15 Claims, 5 Drawing Sheets

OSCILLATOR CIRCUIT OPERATING WITH A VARIABLE DRIVING VOLTAGE

BACKGROUND OF THE INVENTION

1. Field of the Invention

The present invention relates generally to an oscillator operating with a variable driving voltage, and more particularly to an oscillator operating with a variable driving voltage capable of varying the driving voltage of the oscillator in order to regulate the oscillation signal period produced by the oscillator.

2. Description of the Prior Art

In general, an oscillator produces a pulse signal having a predetermined period, and FIG. 1 is a simplified circuit showing the basic structure of a conventional ring oscillator.

A conventional ring oscillator as shown in FIG. 1 includes six inverters and one NAND gate. The inverters are connected to each other in the form of a ring. Each dotted box represents a capacitor connected to or separated from a node of the ring by, for example, a metal option.

Referring to FIG. 1, the conventional ring oscillator is controlled by an enable signal Enable, and the oscillator outputs an oscillation signal of a predetermined period while the enable signal is maintained at a high level. In general, the period of the oscillation signal outputted from a ring oscillator is influenced by the number of the capacitors connected to the ring (as shown in FIG. 1 by metal option). For example, if the number of capacitors connected to the ring increases, an RC delay time will increase, and this will produce an oscillation signal having a longer period. However, if the number of capacitors connected to the ring decreases, the RC delay time will be shortened, and the period of the oscillation signal will also be shortened.

Additionally, the oscillation signal period is influenced by variation in the manufacturing process of the oscillator and the voltage and temperature conditions of the oscillator in operation, and for these reasons, a designer generally provides extra capacitors to the circuit, which are available to be connected to the ring of an oscillator to adjust the period of the oscillation signal. These extra capacitors can be connected to the oscillator or separated from the oscillator by a FIB device (Focused Ion Beam device).

Accordingly, the designers can regulate the oscillation period of the oscillation signal by controlling the number of the capacitors connected to the oscillator (e.g., to the nodes of the ring) by using the FIB device. The work to optimize the oscillation period by connecting capacitors to the oscillator or disconnecting the capacitors from the oscillator by using the FIB device is ordinarily performed at an early development stage of the semiconductor devices.

However, such a work to connect and disconnect the capacitors causes the test time and the costs to significantly increase, especially when a large number of oscillators exists in a semiconductor chip.

Additionally, the extra capacitors provided in a ring oscillator lead to increased ring oscillator circuit area in a semiconductor chip and this imposes a serious burden on the designer when a large number of oscillators is used in a semiconductor chip.

SUMMARY OF THE INVENTION

Accordingly, the present invention has been made to solve the above-mentioned problems occurring in the prior art, and it is an object of the present invention to provide an oscillator capable of outputting a stable oscillation period.

Another object of the present invention is to regulate driving capacitance of an oscillator by regulating a level of voltage outputted from a power supply device driving the oscillator.

Still another object of the present invention is to regulate a period of an oscillation signal outputted from an oscillator by regulating a driving voltage level applied to the oscillator.

The oscillator of the present invention varies the period of an oscillation signal outputted from the oscillator by varying driving voltage of a plurality of logic devices forming the oscillator.

According to the present invention, a voltage generation device is provided to generate driving voltage applied to a plurality of logic devices forming the oscillator.

In order to achieve the above objects, there is provided an oscillator operating with a variable driving voltage, in which a plurality of logic devices are connected to each other in a form of a ring so as to output an oscillation signal having a predetermined period, the oscillator comprising: a voltage generating means for generating first and second driving voltages which are selectively applied to the logic devices, wherein, if the period of the oscillation signal is in a normal state, the first driving voltage is applied to the logic devices, and, if the period of the oscillation signal is faster or slower than the normal state, the second driving voltage is applied to the logic devices, thereby constantly maintaining the period of the oscillation signal.

According to the preferred embodiment of the present invention, if the period of the oscillation signal is slower than the normal state, the second driving voltage is higher than the first driving voltage and if the period of the oscillation signal is faster than the normal state, the second driving voltage is lower than the first driving voltage.

According to another aspect of the present invention, there is provided an oscillator operating with a variable driving voltage, in which a plurality of logic devices are connected to each other in a form of a ring so as to output an oscillation signal having a predetermined period, the oscillator comprising: a means for generating first and second driving voltages which are selectively applied to the logic devices, wherein the voltage generating means includes a reference voltage generation unit for generating a first reference voltage; a first level shifter circuit outputting a second reference voltage by receiving the first reference voltage; a second level shifter circuit outputting a third reference voltage by receiving the first reference voltage; a first driving unit outputting the first driving voltage having an electric potential level identical to that of the second reference voltage by receiving the second reference voltage; and a second driving unit outputting the second driving voltage having an electric potential level identical to that of the third reference voltage by receiving the third reference voltage, wherein, if the period of the oscillation signal is in a normal state, the first driving voltage is applied to the logic devices, and, if the period of the oscillation signal is faster or slower than the normal state, the second driving voltage is applied to the logic devices, thereby constantly maintaining the period of the oscillation signal.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be explained with reference to the accompanying drawings.

Figure 1:
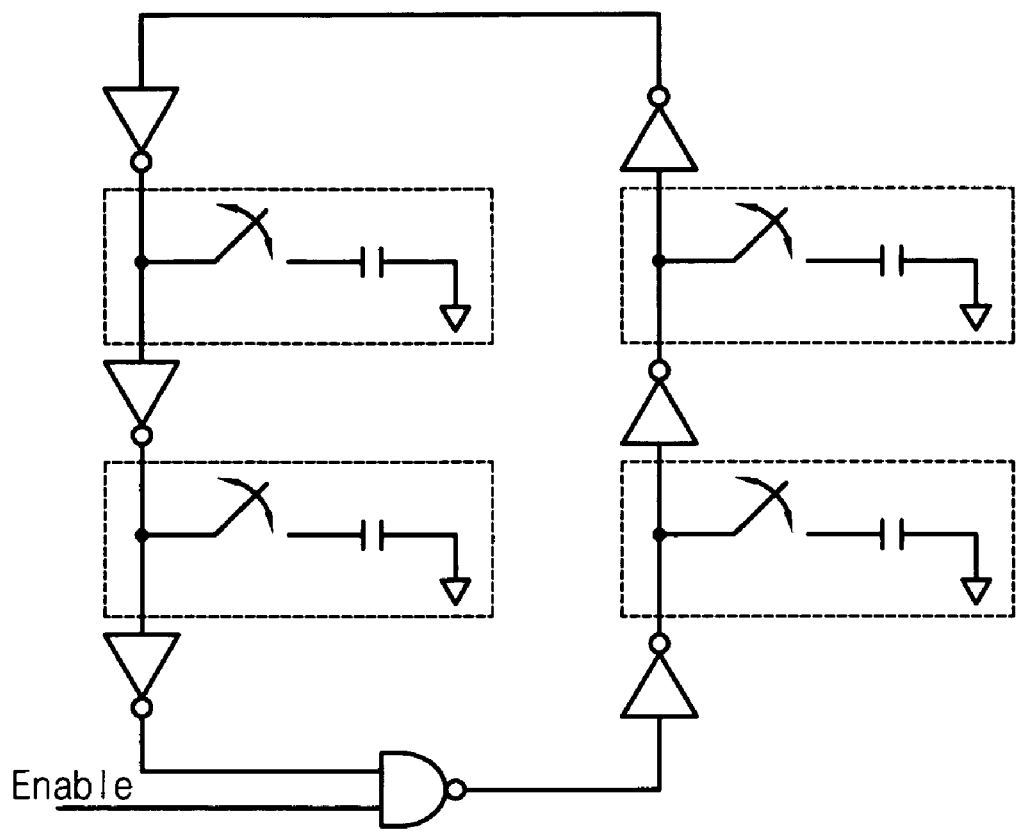
FIG. 1 shows the basic circuit of a conventional ring oscillator.
Figure 2A:
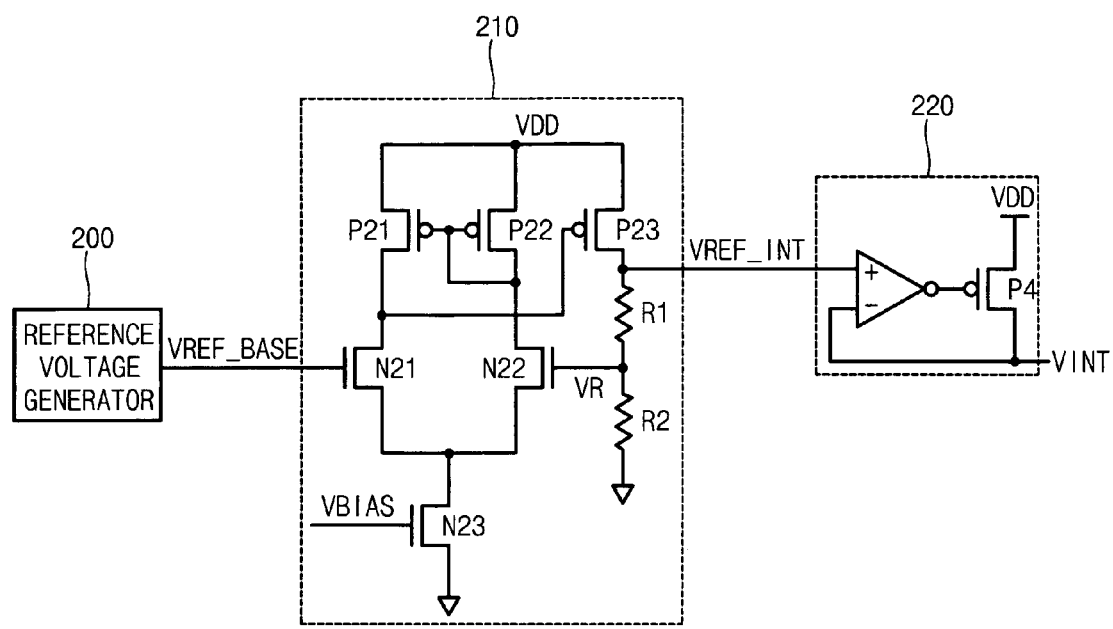
FIG. 2A is a view showing an internal voltage generator according to an embodiment of the present invention.

FIG. 2A is a view showing an internal voltage generator according to an embodiment of the present invention.

Referring to FIG. 2A, the internal voltage generator includes a reference voltage generator 200 generating a first reference voltage $V_{REF\_BASE}$, a level shifter circuit 210 outputting a second reference voltage $V_{REF\_INT}$ by varying an electric potential level of the first reference voltage $V_{REF\_BASE}$, and a driving unit 220 outputting an internal voltage $V_{INT}$ applied to an internal circuit of a semiconductor device by receiving the second reference voltage $V_{REF\_INT}$.

The reference voltage generator 200 generating a predetermined reference voltage may be selected from the well-known circuits (for example, a bandgap reference voltage generator or a Widlar reference voltage generator) that are used to generate reference voltages.

The level shifter circuit 210 generates an output signal $V_{REF\_INT}$ (i.e., the second reference voltage) having a second electric potential level after receiving and based on the input signal $V_{REF\_BASE}$ (i.e., the first reference voltage) having the first electric potential level.

The level shifter circuit 210 according to an embodiment of the present invention includes, inter alia, the following components:

(1) first, second, and third PMOS transistors P21, P22, P23 receiving a supply voltage $V_{DD}$ through a source terminal;

(2) a first NMOS transistor N21 receiving the first reference voltage $V_{REF\_BASE}$ through a gate terminal;

(3) a second NMOS transistor N22 connected between a drain terminal of the second PMOS transistors P22 and a source terminal of the first NMOS transistors N21;

(4) a third NMOS transistor N23 receiving a bias voltage $V_{BIAS}$ through the gate terminal;

(5) a first resistance element R1 connected between a drain terminal of the third PMOS transistor P23 and a node connecting the second NMOS transistor N22; and (6) a second resistance element R2 connected between the ground and the node connecting the second NMOS transistor N22 and the first resistance element R1.

In the level shifter 210, it is noted that the first and second NMOS transistors N21, N22 are arranged to form a differential amplifier with two input terminals: a first input terminal at the gate terminal of the first NMOS transistor N21 and a second input terminal at the gate terminal of the second NMOS transistor N22. The transistor P23 in the level shifter circuit 210 is turned ON by the first reference voltage $V_{REF\_BASE}$ applied to the first input terminal of the differential amplifier. If the transistor P23 is turned ON, a voltage $V_R$ of the second input terminal of the differential amplifier rises until voltage $V_R$ reaches the first reference voltage $V_{REF\_BASE}$. Then, the first reference voltage $V_{REF\_BASE}$ and the voltage $V_R$ is maintained at the same electric potential level by a feedback operation. In this case, the current flowing through a resistor R2 is $V_R/R2$, so the second reference voltage $V_{REF\_INT}$ outputted from the level shifter circuit 210 is calculated as follows:

$$V_{REF\_INT} = V_R(1+R1/R2).$$

Accordingly, the electric potential level of the second reference voltage $V_{REF\_INT}$ of the level shifter circuit 210 is shifted into a higher electric potential level than the electric potential level of the first reference voltage $V_{REF\_BASE}$.

The driving unit 220 is a driving circuit for outputting the output voltage $V_{INT}$ used in an internal semiconductor device, such as a ring oscillator, by receiving the second reference voltage $V_{REF\_INT}$ outputted from the level shifter circuit 210.

The driving unit 220 compares the second reference voltage $V_{REF\_INT}$ with an output voltage $V_{INT}$. When the output voltage $V_{INT}$ of the driving unit 220 drops down below the second reference voltage $V_{REF\_INT}$, a transistor P4 would turn ON. If the transistor P4 is turned ON, a current is supplied to the transistor P4 from an external supply voltage $V_{DD}$, so that the electric potential level of the output voltage $V_{INT}$ of the transistor P4 rises until it reaches the electric potential level of the second reference voltage $V_{REF\_INT}$ of the transistor P4.

Figure 2B:
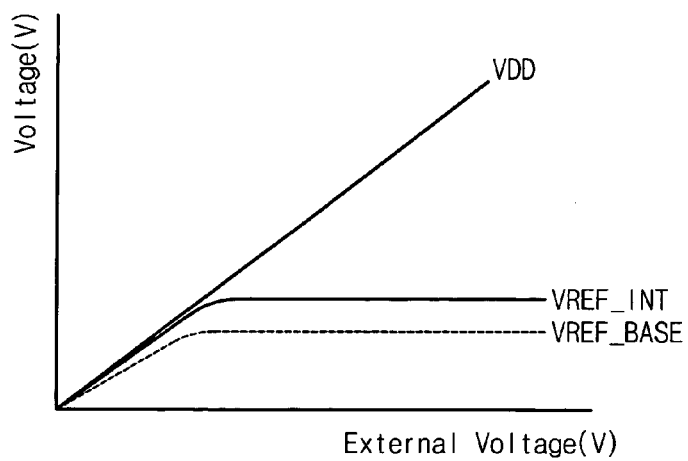
FIG. 2B is a graph showing a voltage of a circuit shown in FIG. 2A.

FIG. 2B is a graph showing a voltage of the circuit shown in FIG. 2A.

The external supply voltage $V_{DD}$, the first reference voltage $V_{REF\_BASE}$ outputted from a reference voltage generator 200, and the second reference voltage $V_{REF\_INT}$ outputted from the level shifter circuit 210 are shown in FIG. 2B. If a predetermined period of time has passed after the external supply voltage $V_{DD}$ has been supplied, the first reference voltage $V_{REF\_BASE}$ and the second reference voltage $V_{REF\_INT}$ maintain a constant voltage level.

Figure 3:
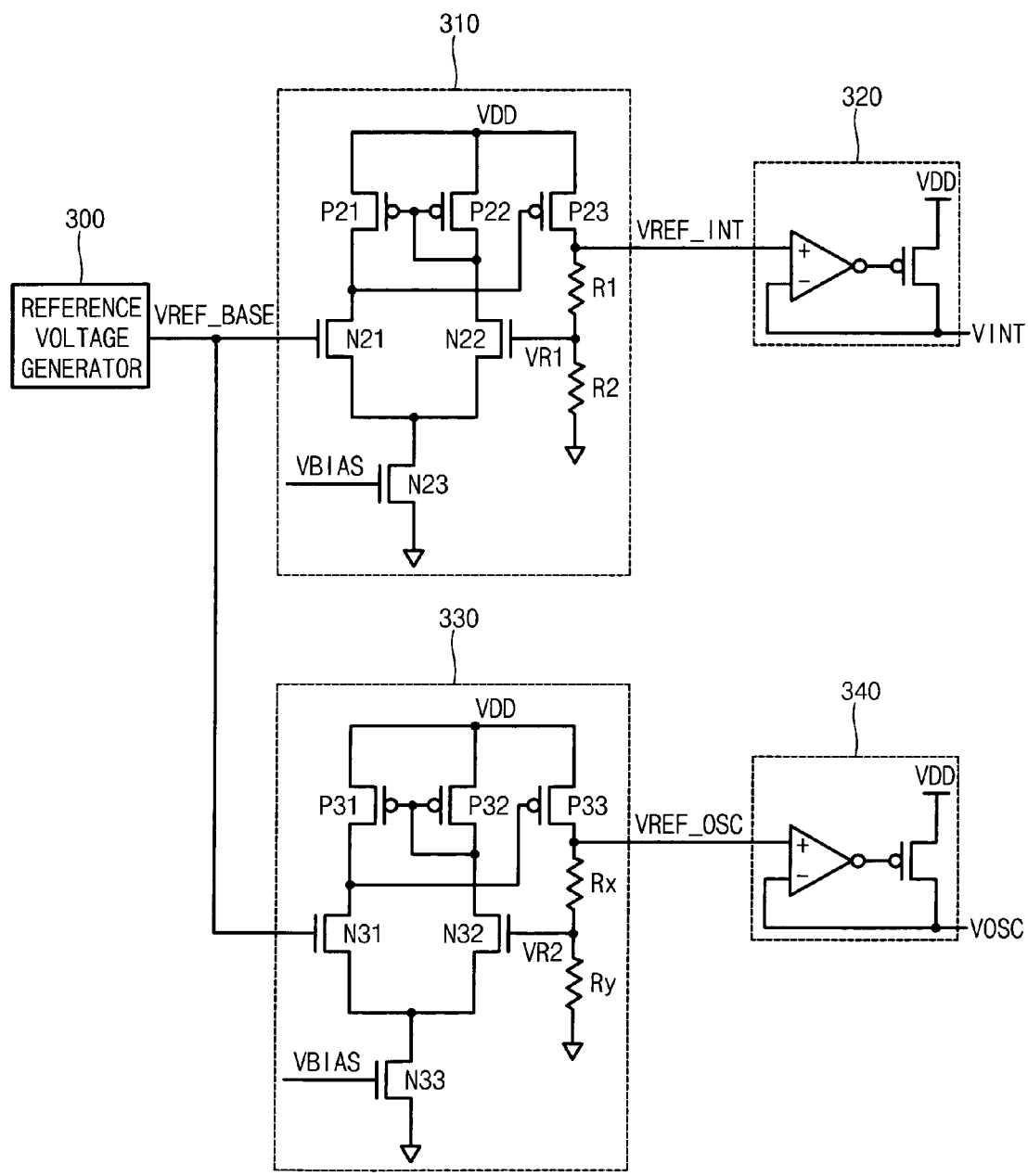
FIG. 3 is a view showing an internal voltage generator according to another embodiment of the present invention.

FIG. 3 is a view showing an internal voltage generator according to another embodiment of the present invention.

An internal voltage generator shown in FIG. 3 includes:

(1) a reference voltage generator 300 generating a first reference voltage $V_{REF\_BASE}$;

(2) a first level shifter circuit 310 outputting a second reference voltage $V_{REF\_INT}$ by varying the electric potential level of the first reference voltage $V_{REF\_BASE}$;

(3) a first driving unit 320 outputting a first internal voltage $V_{INT}$ by receiving the second reference voltage $V_{REF\_INT}$;

(4) a second level shifter circuit 330 outputting a third reference voltage $V_{REF\_OSC}$ by varying the electric potential level of the first reference voltage $V_{REF\_BASE}$; and (5) a second driving unit 340 outputting a second internal voltage $V_{OSC}$ by receiving the third reference voltage $V_{REF\_OSC}$.

The first internal voltage $V_{INT}$ of the first driving unit 320 is regulated such that the first internal voltage $V_{INT}$ becomes identical to the second reference voltage $V_{REF\_INT}$ by a feedback operation. Likewisem, the second internal voltage $V_{OSC}$ of the second driving unit 340 is regulated such that the second internal voltage $V_{OSC}$ becomes identical to the third reference voltage $V_{REF\_OSC}$.

A structure of the internal voltage generator shown in FIG. 3 is identical to a structure of the internal voltage generator shown in FIG. 2, except that FIG. 3 additionally includes the second level shifter circuit 330 and the second driving unit 340.

Referring to FIG. 3, the level shifter circuit 330 includes:

(1) first, second, and third PMOS transistors P31, P32, P33 receiving a supply voltage $V_{DD}$ through a source terminal, (2) a first NMOS transistor N31 receiving the first reference voltage $V_{REF\_BASE}$ through a gate terminal, (3) a second NMOS transistor N32 connected between a drain terminal of the second PMOS transistors P32 and a source terminal of the first NMOS transistors N31, (4) a third NMOS transistor N33 receiving a bias voltage $V_{BIAS}$ through the gate terminal, (5) a first resistance element $R_X$ connected between a drain terminal of the third PMOS transistor P33 and a first node, and (6) a second resistance element Ry connected between the first node and ground.

The gate terminal of the first PMOS transistor P31 is connected to the gate terminal of the second PMOS transistor P32, and the gate and source terminals of the second PMOS transistor P32 are connected with each other. The drain terminal of the first PMOS transistor P31 is connected to the drain terminal of the first NMOS transistor N31, and the drain terminal of the second PMOS transistor P32 is connected to the drain terminal of the second NMOS transistor N32. In addition, the source terminal of the first NMOS transistor N31 is connected to the source terminal of the second NMOS transistor N32, and the third NMOS transistor N33 is connected between the source terminal of the first NMOS transistors N31 and the earth. The drain terminal of the first NMOS transistor N31 is connected to the gate terminal of the third PMOS transistor P33, and the gate terminal of the second NMOS transistor N32 is connected to the node where $R_X$ and $R_Y$ are connected to (as shown in FIG. 3). Also, the third reference voltage $V_{REF\_OSC}$ is outputted from the drain terminal of the third PMOS transistor P33.

Referring to FIG. 3, the second reference voltage $V_{REF\_INT}$ outputted from the first level shifter circuit 310 is designed to be different from the third reference voltage $V_{REF\_OSC}$ outputted from the second level shifter circuit 330. The basic operation of the second level shifter circuit 330 is identical to an operation of the level shifter circuit 210 described with reference to FIG. 2a. That is, a voltage $VR_2$ of a differential amplifier is maintained identical to the first reference voltage $V_{REF\_BASE}$ by a feedback operation. Accordingly, the third reference voltage $V_{REF\_OSC}$ of the second level shifter circuit 330 will be represented as follows:

$$V_{REF\_OSC}=V_{R2}*(1+R_X/R_Y)$$

Therefore, the third reference voltage $V_{REF\_OSC}$ of the second level shifter circuit 330 can be regulated by varying values of resistors $R_X$ and $R_Y$.

As described above, the first and second internal voltages $V_{INT}$ and $V_{OSC}$ outputted from the internal voltage generator can be selectively applied to an internal circuit of the semiconductor device.

Figure 4A:
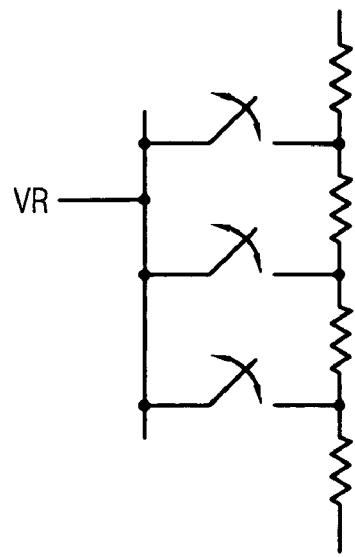
FIGS. 4A, 4B and 4C are views showing resistance devices used the internal voltage generator shown in FIG. 3.
Figure 4B:
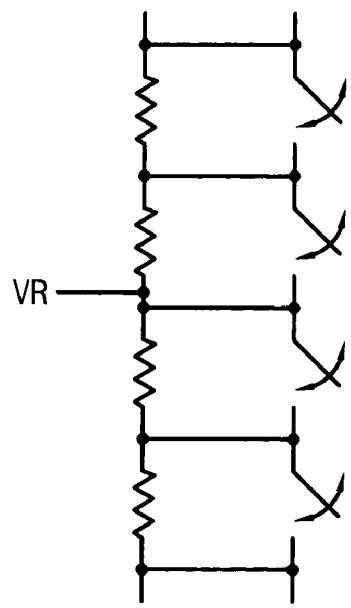
Figure 4C:
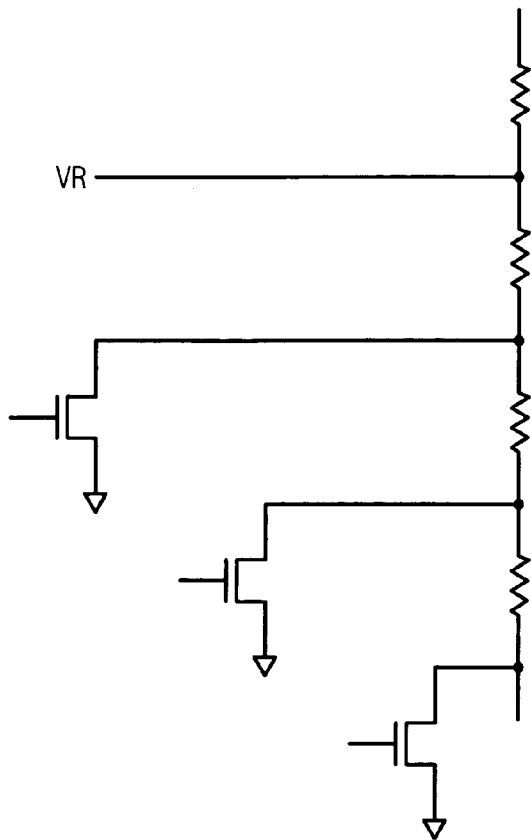

FIGS. 4A to 4C are views showing various examples of resistance ratios ($R_X/R_Y$) described with reference to FIG. 3.

It can be understood from FIGS. 4A and 4B that the resistance ratio $R_X/R_Y$ may be regulated by means of a metal switch through utilizing a metal short state or a metal open state. This will determine the number of resistors connected to or disconnected to the circuit for the $R_X/R_Y$ ratio. Also, as shown in FIG. 4C, the resistance ratio $R_X/R_Y$ can be regulated by turning ON or OFF a transistor. Accordingly, an electric potential level of the third reference voltage $V_{REF\_OSC}$ outputted from the second level shifter circuit 330 can be regulated through regulating the resistance ratio $R_X/R_Y$.

Figure 5:
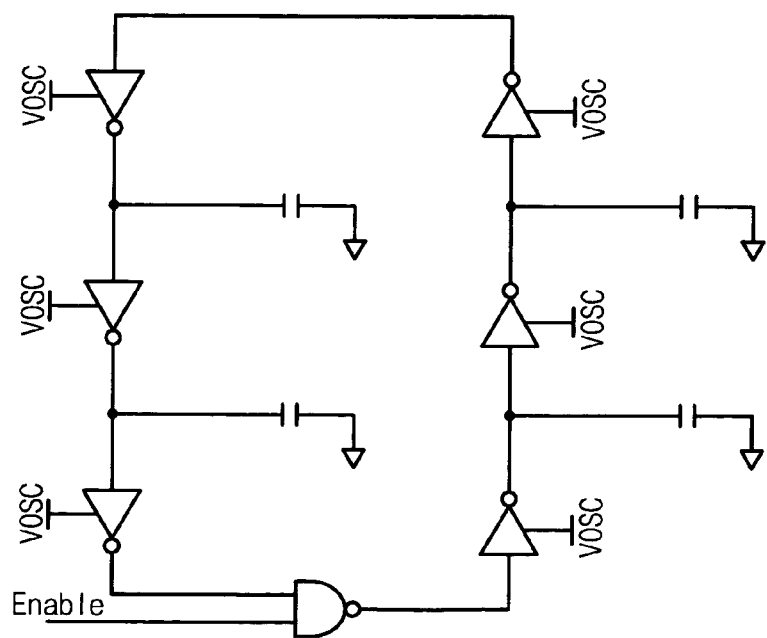
FIG. 5 is a circuit view showing an oscillator driven by the voltage outputted from the internal voltage generator shown in FIG. 3.

FIG. 5 shows an embodiment of an oscillator using a second internal voltage $V_{OSC}$ outputted from an internal voltage generator shown in FIG. 3 as the driving voltage.

The oscillator of FIG. 5 includes six inverters and one NAND gate, but it should be recognized as well known by those skilled in the art the numbers may vary. These logic devices of inverters and the gate are connected to each other in the form of a ring. The driving voltage of these logic devices is the second internal voltage $V_{OSC}$ of the internal voltage generator.

In contrast to the conventional art, the ring oscillator of the present invention does not require extra or spare capacitors to be built in for purposes of adjusting the period of the oscillation signal or others. Only the number of capacitors required by design are provided in the oscillator of the present invention without an optional capacitor to be connected to a node of the oscillator circuit, for example, by means of an FIB device. That is, all capacitors shown in FIG. 5 represent the basic capacitors capable of generating an oscillation period targeted by a designer at the early stage.

The operational details of the oscillator of the present invention as shown in FIG. 5 are described as follows.

First, the oscillation period of the signal outputted from an oscillator is inspected by using the first internal voltage $V_{INT}$ of an internal voltage generator as a driving voltage of the oscillator. As described above, the first internal voltage $V_{INT}$ of the internal voltage generator is identical to the second reference voltage $V_{REF\_INT}$ due to the feedback operation. The second internal voltage $V_{OSC}$ of the internal voltage generator is identical to the third reference voltage $V_{REF\_OSC}$ due to the feedback operation.

If the inspected oscillation period is determined to be identical to the target oscillation period, the voltage driving the oscillator is set to the first internal voltage $V_{INT}$.

If on the other hand, the inspected oscillation period is determined to be shorter than the target oscillation period, the second internal voltage $V_{OSC}$ of the internal voltage generator is used as a driving voltage of the oscillator. In this case, the resistance ratio $R_X/R_Y$ is regulated such that the electric potential level of the second internal voltage $V_{OSC}$ is adjusted in comparison to the first internal voltage $V_{INT}$, that is, for example, lower than the first internal voltage $V_{INT}$.

As a result of such an inspection, if the tested oscillation period is determined to be longer than the target oscillation period, the second internal voltage $V_{OSC}$ of the internal voltage generator is used as the driving voltage of the oscillator. In this case, the resistance ratio $R_X/R_Y$ is regulated such that the electric potential level of the second internal voltage $V_{OSC}$ becomes higher than the first internal voltage $V_{INT}$.

Although it is described that the present invention uses two level shifter circuits 310 and 330, the same effect can be achieved by using only one level shifter circuit 330.

As described above, the present invention provides very novel way to regulate the period of an oscillation signal by regulating the driving voltage of an oscillator. To achieve this task, the present invention provides, among other things, an internal voltage generator that is capable of generating a variable internal voltage. The internal voltage generator of the present invention is not only capable of supplying the driving voltage to the oscillator, but also capable of generating and supplying a predetermined voltage required by the semiconductor device itself.

As explained above, the conventional method requires that a plurality of extra or optional capacitors must be connected to the oscillator or separated from the oscillator in order to regulate the period of the oscillation signal outputted from an oscillator. However, such a conventional method unnecessarily increases the test time and cost.

According to the present invention, the period of an oscillation signal is regulated by varying a driving voltage of the oscillator without an optional capacitor designed into the circuit, so that the testing time and the testing cost are significantly reduced.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. An oscillator operating with a variable driving voltage to produce an oscillation signal of a predetermined period, the oscillator having a plurality of logic devices connected to each other in a form of a ring, the oscillator comprising:
    a voltage generating circuit, that generates first and second driving voltages which are selectively applied to the logic devices, said second driving voltages being higher than the first driving voltages when the oscillation signal period is shorter than the predetermined period;
    wherein the selective application of the first or second driving voltage to the logic devices affects the period of the oscillation signal produced; and
    further wherein the first driving voltage is applied to the logic devices for normal operations when the oscillation signal period is substantially equal the predetermined period or the second driving voltage is applied to the logic devices for normal operations when the oscillation signal period is different from the predetermined period.

2. The oscillator of claim 1 further comprising: means for adjusting the second driving voltage having at least two resistors.

3. The oscillator of claim 1, wherein the second driving voltage is lower than the first driving voltage when the oscillation signal period is longer than the predetermined period.

4. The oscillator of claim 1, wherein the logic devices connected to each other in the form of a ring include inverters.

5. The oscillator of claim 1, wherein the voltage generating circuit comprises one or more of driving voltage generating units, wherein each driving voltage generating unit comprises: a reference voltage generator for generating a first reference voltage; a level shifter circuit for receiving the first reference voltage and outputting a second reference voltage; and a driving unit for receiving the second reference voltage and outputting a first driving signal having an electric potential level substantially identical to that of the second reference voltage, wherein the first driving signal is available for use as the first or second driving voltage to the logic devices.

6. The oscillator as claimed in claim 4, wherein the level shifter circuit comprises:
    a first NMOS transistor receiving the first reference voltage through a first NMOS gate terminal;
    first, second, and third PMOS transistors receiving a supply voltage through the source terminal of each of the first, second, and third PMOS transistors,
    wherein the gate terminal of the first PMOS transistor is connected to the gate terminal of the second PMOS transistor, the gate and source terminals of the second PMOS transistor are connected, the drain terminal of the first PMOS transistor is connected to the drain terminal of the first NMOS transistor, the drain terminal of the first NMOS transistor is connected to the gate terminal of the third PMOS transistor;
    a second NMOS transistor connected between a drain terminal of the second PMOS transistor and a source terminal of the first NMOS transistor,
    wherein the drain terminal of the second PMOS transistor is connected to the drain terminal of the second NMOS transistor, the source terminal of the first NMOS transistor is connected to the source terminal of the second NMOS transistor,
    a third NMOS transistor receiving a bias voltage through a third NMOS transistor gate terminal, wherein the third NMOS transistor is connected between the source terminal of the first NMOS transistors and the ground;
    a first resistance element connected between a drain terminal of the third PMOS transistor and the second NMOS transistor gate terminal; and
    a second resistance element connected between the second NMOS transistor gate terminal and the ground,
    wherein the drain terminal of the third PMOS transistor outputs the driving voltage of the driving voltage generating unit.

7. The oscillator as claimed in claim 6, wherein the driving voltage of the driving voltage generating unit is regulated by changing the resistance ratio of the first and second resistance elements.

8. An oscillator operating with a variable driving voltage to produce an oscillation signal of a predetermined period, the oscillator having a plurality of logic devices connected to each other in a form of a ring, the oscillator comprising:
    a voltage generating means for generating first and second driving voltages which are selectively applied to the logic devices,
    wherein the selective application of the first or second driving voltage to the logic devices affects the period of the oscillation signal produced, the voltage generating means further comprising:
    a first driving voltage generating unit generating the first driving voltage; and
    a second driving voltage generating unit generating the second driving voltage, the second driving voltage generating unit including the voltage regulating means for regulating the level of the second driving voltage,
    wherein either the first driving voltage is applied to the logic devices for normal operations when the oscillation signal period is substantially equal the predetermined period or the second driving voltage is applied to the logic devices for normal operations when the oscillation signal is different from the predetermined period.

9. The oscillator of claim 8, wherein the voltage regulating means includes at least first and second resistance elements and wherein the electric potential level of the second driving voltage is regulated by varying the resistance ratio between at least first and second resistance elements in the voltage regulating means.

10. The oscillator of claim 9, wherein the second driving voltage is regulated to be higher than the first driving voltage by adjusting the resistance ratio when the oscillation signal period is shorter than the predetermined period.

11. The oscillator of claim 9, wherein the second driving voltage is regulated to be lower than the first driving voltage by adjusting the resistance ratio when the oscillation signal period is longer than the predetermined period.

12. The oscillator of claim 9, wherein the first driving voltage generating unit comprises:
   a first level shifter circuit for receiving a first reference voltage and generating a second reference voltage; and
   a first driving unit for receiving the second reference voltage and generating the first driving voltage,
   wherein the first driving unit regulates the first driving voltage to substantially equal the second reference voltage.

13. The oscillator of claim 12, wherein the first level shifter circuit comprises:
   a first NMOS transistor receiving the first reference voltage through a first NMOS gate terminal:
   first, second, and third PMOS transistors receiving a supply voltage through the source terminal of each of the first, second, and third PMOS transistors,
   wherein the gate terminal of the first PMOS transistor is connected to the gate terminal of the second PMOS transistor, the gate and source terminals of the second PMOS transistor are connected, the drain terminal of the first PMOS transistor is connected to the drain terminal of the first NMOS transistor, the drain terminal of the first NMOS transistor is connected to the gate terminal of the third PMOS transistor; a second NMOS transistor connected between a drain terminal of the second PMOS transistor and a source terminal of the first NMOS transistor,
   wherein the drain terminal of the second PMOS transistor is connected to the drain terminal of the second NMOS transistor, the source terminal of the first NMOS transistor is connected to the source terminal of the second NMOS transistor;
   a third NMOS transistor receiving a bias voltage through a third NMOS transistor gate terminal, wherein the third NMOS transistor is connected between the source terminal of the first NMOS transistors and the ground;
   a third resistance element connected between a drain terminal of the third PMOS transistor and the second NMOS transistor gate terminal; and
   a fourth resistance element connected between the second NMOS transistor gate terminal and the ground, wherein the drain terminal of the third PMOS transistor outputs the second reference voltage.

14. The oscillator of claim 9, wherein the second driving voltage generating unit comprises:
   a second level shifter circuit for receiving a first reference voltage and generating a third reference voltage; and
   a second driving unit for receiving the third reference voltage and generating the second driving voltage,
   wherein the second driving unit regulates the second driving voltage to substantially equal the third reference voltage.

15. The oscillator of claim 12, wherein the second level shifter circuit comprises:
   a fourth NMOS transistor receiving the first reference voltage through a fourth NMOS gate terminal;
   fourth, fifth, and sixth PMOS transistors receiving a supply voltage through the source terminal of each of the fourth, fifth, and sixth PMOS transistors,
   wherein the gate terminal of the fourth PMOS transistor is connected to the gate terminal of the fifth PMOS transistor, the gate and source terminals of the fifth PMOS transistor are connected, the drain terminal of the fourth PMOS transistor is connected to the drain terminal of the fourth NMOS transistor, the drain terminal of the fourth NMOS transistor is connected to the gate terminal of the sixth PMOS transistor; a fifth NMOS transistor connected between a drain terminal of the fifth PMOS transistor and a source terminal of the fourth NMOS transistor,
   wherein the drain terminal of the fifth PMOS transistor is connected to the drain terminal of the fifth NMOS transistor, the source terminal of the fourth NMOS transistor is connected to the source terminal of the fifth NMOS transistor;
   a sixth NMOS transistor receiving a bias voltage through a sixth NMOS transistor gate terminal, wherein the sixth NMOS transistor is connected between the source terminal of the fourth NMOS transistors and the ground;
   the first resistance element connected between a drain terminal of the sixth PMOS transistor and the fifth NMOS transistor gate terminal; and
   the third resistance element connected between the fifth NMOS transistor gate terminal and the ground, wherein the drain terminal of the sixth PMOS transistor outputs the third reference voltage.

* * * * *